(12) United States Patent
Haque et al.

(10) Patent No.: US 8,707,734 B2
(45) Date of Patent: Apr. 29, 2014

(54) METHOD OF EMBEDDING MATERIAL IN A GLASS SUBSTRATE

(75) Inventors: Razi-ul Haque, Ann Arbor, MI (US); Kensall Wise, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 642 days.

(21) Appl. No.: 12/581,695

(22) Filed: Oct. 19, 2009

(65) Prior Publication Data
US 2011/0091687 A1   Apr. 21, 2011

(51) Int. Cl.
*C03C 27/04* (2006.01)
(52) U.S. Cl.
USPC ............................ 65/59.31; 65/36; 65/60.1
(58) Field of Classification Search
USPC ........ 438/455–459, 478–509; 65/30.1, 30.12, 65/31, 36, 42–44, 48, 60.1–60.4, 60.8, 61
See application file for complete search history.

(56) References Cited

U.S. PATENT DOCUMENTS

| | | | | |
|---|---|---|---|---|
| 3,202,489 | A * | 8/1965 | Bender et al. ................. | 428/620 |
| 3,883,339 | A * | 5/1975 | Michalik et al. ................ | 65/114 |
| 5,639,325 | A * | 6/1997 | Stevens et al. ................. | 438/22 |
| 5,861,676 | A | 1/1999 | Yen | |
| 5,990,560 | A * | 11/1999 | Coult et al. .................... | 257/772 |
| 6,238,580 | B1 * | 5/2001 | Cole et al. ........................ | 216/2 |
| 7,084,073 | B2 | 8/2006 | Lee et al. | |
| 7,381,583 | B1 * | 6/2008 | Ebel et al. ....................... | 438/53 |
| 2002/0058332 | A1 * | 5/2002 | Quake et al. ................ | 435/288.3 |
| 2004/0058466 | A1 * | 3/2004 | Ushijima et al. ................ | 438/31 |
| 2004/0180464 | A1 | 9/2004 | Horning et al. | |
| 2004/0217455 | A1 | 11/2004 | Shiono et al. | |
| 2005/0157396 | A1 * | 7/2005 | Teshima et al. ............... | 359/619 |
| 2006/0038288 | A1 | 2/2006 | Yoshioka et al. | |
| 2007/0114623 | A1 | 5/2007 | Kuisma | |
| 2008/0009763 | A1 * | 1/2008 | Chiou et al. ................... | 600/544 |
| 2008/0217784 | A1 * | 9/2008 | Binder et al. .................. | 257/762 |
| 2008/0236174 | A1 | 10/2008 | Tanielian | |
| 2008/0283293 | A1 | 11/2008 | Rogier et al. | |
| 2009/0072272 | A1 * | 3/2009 | Suh et al. ........................ | 257/194 |
| 2010/0120018 | A1 * | 5/2010 | Quake et al. ........................ | 435/5 |
| 2010/0200781 | A1 * | 8/2010 | Khorasani et al. ............ | 250/576 |
| 2010/0301430 | A1 * | 12/2010 | Huang ........................... | 257/415 |
| 2012/0174572 | A1 * | 7/2012 | Clausi et al. ..................... | 60/527 |

OTHER PUBLICATIONS

Abe et al., "Endpoint detectable plating through femtosecond laser drilled glass wafers for electrical interconnections", Sensors and Actuators, A 108, 2003, pp. 234-238.

(Continued)

*Primary Examiner* — Jodi C Franklin
(74) *Attorney, Agent, or Firm* — Howard & Howard Attorneys PLLC

(57) ABSTRACT

A method of embedding material in a glass substrate is provided. The method includes providing a glass composition and a mold substrate having a patterned surface defining a recess therein. The mold substrate is formed from a material having a higher reflow temperature than the glass composition. A surface wettability of the patterned surface is increased relative to the glass composition. At least a portion of the glass composition is flowed into the recess defined by the patterned surface of the mold substrate, followed by solidifying the glass composition to form a solidified glass layer. Material is removed from the solidified glass layer until a portion of the underlying patterned surface of the mold substrate is exposed with at least a portion of the mold substrate embedded in the solidified glass layer to thereby form the glass substrate having the material embedded therein.

27 Claims, 6 Drawing Sheets

(56) References Cited

OTHER PUBLICATIONS

Brunschwiler et al., "Forced Convective Interlayer Cooling In Vertically Integrated Packages", IEEE, 2008, pp. 1114-1125.

Diepold et al., "Smoothing of ultrasonically drilled holes in borosilicate glass by wet chemical etching", J. Micromech. Microeng. 6, 1996, pp. 29-32.

Eklund et al., "Glass Blowing on a Wafer Level", Journal of Microelectromechanical Systems, vol. 16, No. 2, Apr. 2007, pp. 232-239.

Ho et al., "High RF Performance TSV Silicon Carrier for High Frequency Application", Electronic Components and Technology Conference, 2008, pp. 1946-1952.

Kolari, "Deep plasma etching of glass with a silicon shadow mask", Sensors and Actuators A 141, Sep. 13, 2007, pp. 677-684.

Li et al., "Deep reactive ion etching of Pyrex glass using SF6 plasma", Sensors and Actuators A 87, 2001, pp. 139-145.

Lin et al., "Implementation of silicon-on-glass MEMS devices with embedded through-wafer silicon vias using the glass reflow process for wafer-level packaging and 3D chip integration", Journal of Micromech.Microeng., 18, 2008, pp. 1-6.

Merz et al., "A novel micromachining technology for structuring borosilicate glass substrates", Actuators and Microsystems, 2003, pp. 258-261.

Oberhammer et al., "Incrementally Etched Electrical Feedthroughs For Wafer-Level Transfer of Glass Lid Packages", Actuators and Microsystems, 2003, pp. 1832-1835.

Perry et al., "Oxide etch behavior in a high-density, low pressure, inductively coupled C2F6 plasma: Etch rates, selectivity to photoresist, plasma parameters, and CFx radical densities", J. Vac. Sci Technol. A 19(5), 2001, pp. 2272-2281.

Seki et al., "Bonding of a Si microstructure using field-assisted glass melting", J. Micromech. Microeng. 18, 2008, pp. 1-5.

Soh et al., "Ultra-Low Resistance, Through-Wafer Via (TWV) Technology and Its Applications in Three Dimensional Structures on Silicon", Jpn. J. Appl. Phys., vol. 38, 1999, pp. 2393-2396.

Spiesshoefer et al., "Copper electroplating to fill blind vias for three-dimensional integration", J. Vac. Sci. Technology A 24(4), 2006, pp. 1277-1282.

Tanaka et al., "Glass substrate with high density electrical feedthroughs", Proc. Sens Symp. Sens. Micromachines Appl. Syst., vol. 23, 2006, pp. 9-14.

Tanaka et al., "Laterally stacked glass substrates with high density electrical feedthroughs", Journal of Micromechanics and Microengineering, 17, 2007, pp. 597-602.

Tu et al., "Production Worthy 3D Interconnect Technology", IEEE, 2008, pp. 37-39.

Wensink et al., "High Resolution Powder Blast Micromachining", IEEE, 2000, p. 769-774.

Zhang et al., "Fast Copper Plating Process for TSV Fill", Microsystems, Packaging, Assembly and Circuits Technology, 2007, pp. 219-222.

Zheng et al., "3D microstructuring of Pyrex glass using the electrochemical discharge machining process", Journal of Micromech. Microeng., 17, 2007, pp. 960-966.

Imis, 3D-IC Alliance, Jun. 1, 2008, 33 pages.

Lapedus, "Will 3D through-silicon vias break into mainstream", EE Times, Jun. 6, 2008, 2 pages.

Toshiba To Enhance Competitiveness In Image Sensor Business By Bringing Manufacturing of CMOS Camera Modules For Mobile Phones In-House, www.toshiba.com, Oct. 1, 2007, 2 pages.

"Toshiba CMOS Image Sensor With TSV Technology Reverse Engineered", I-Micronews, Sep. 16, 2008, 2 pages.

"Elements of VTI's 3D-MEMs", VTI Technologies, Mar. 20, 2007, 4 pages.

Bauer, "First High Volume Via Process For Packaging and Integration of MEMS/CMOS", Silex Microsystems, 6 pages, downloaded from http://www.silexmicrosystems.com/docs/Sil-ViaWithZeroCrosstalkFeature-FirstHighVolumeViaProcessForPackagingAndIntegrationOfMEMS&CMOS.pdf on May 26, 2010.

Schott HermeS Product Information, http://www.schott.com/epackaging/english/download/schott_hermes_new_eng.pdf, downloaded on May 10, 2010, 1 page.

"Glass Wafer With Conductive Through Metal Via", Tecnisco Ltd., www.tecnisco.co.jp, downloaded on May 10, 2010, 2 pages.

Cu, Xiaoyun, "Glass As A Substrate for High Density Electrical Inter Connect" In: 10th Electronics Packaging Technology Conference, IEEE, 2008, pp. 12-17.

International Search Report, PCT/US2010/053221, Jun. 22, 2011, 3 pages.

* cited by examiner

METHOD OF EMBEDDING MATERIAL IN A GLASS SUBSTRATE

GOVERNMENT LICENSE RIGHTS

This invention was made with government support under EEC 9986866 awarded by National Science Foundation. The government has certain rights in the invention.

BACKGROUND OF THE INVENTION

1. Field of the Invention

The instant invention generally relates to a method of embedding material in a glass substrate. More specifically, the instant invention relates to a method of flowing a glass composition into a recess in a patterned surface of a mold substrate formed from the material to form a glass substrate, with the resulting glass substrate having the material of the mold substrate embedded therein.

2. Description of the Related Art

The field of electronic microsystems covers a broad array of technologies that benefit from functionality of electronic devices but in which minimal size is desired. For example, implantable devices, batteries, integrated circuits, microfluidic circuits and associated devices such as pumps and valves represent a few technologies that benefit from advances in the field of electronic microsystems. There is a constant drive to make advances in the field of electronic microsystems that enables further minimization in size while retaining or improving the functionality of the electronic microsystems.

Electronic microsystems commonly employ an architecture of electrical components and insulative components. Due to the small profile of the electronic microsystems, the insulative components serve a vital function of electrically separating the electrical components to enable proper function. However, there is often a need to convey electrical signals between electrical components that are separated by insulative components. In this regard, there is a strong desire to employ electronic feedthroughs or vias that pass directly through the insulative components, rather than traveling around the insulative components. The electronic feedthroughs or vias provide the benefit of shorter wire lengths, which results in lower resistive loss and lower consumption of precious space in the electronic microsystems as compared to usage of longer wire lengths that would be required to travel around the insulative components. There is also a desire to incorporate devices into the insulative components to maximize insulation thereof and to further conserve space in the electronic microsystems.

Glass is an ideal material for use in electronic microsystems due to excellent electrically insulative properties thereof, as well as biological neutrality and low coefficient of thermal expansion. However, formation of electronic feedthroughs or vias in glass is particularly problematic in the field of electronic microsystems and has often led to a preference for polymeric materials for use in the insulative components. Electroplating of vertical feedthroughs in glass is known in the art. Existing processes such as sand blasting, ultrasonic drilling, electrochemical etching, laser drilling, RIE etching, and mechanical drilling have been used to generate holes in the glass for purposes of accommodating the vertical feedthroughs or vias. Due to the extremely small dimensions of the holes, traditional glass molding techniques are not considered. The aforementioned processes used to generate holes in the glass suffer from drawbacks such as an inability to achieve sufficient spatial resolution with sufficient repeatability, propensity to damage the glass or alter the surface thereof in an undesirable manner, limitations as to the size of holes that can be generated, and/or limitation to batch mode processing.

Methods of structuring wafers comprising glass and silicon regions have been suggested in the art. Such methods include the step of structuring a surface of a flat silicon substrate to obtain recesses therein. A flat glass substrate is then anodically bonded to the structured surface of the silicon substrate under vacuum to at least partially cover the structured surface of the silicon substrate. The glass substrate and the silicon substrate are then tempered in such a manner that the glass is heated above a reflow temperature thereof and flows into the recesses of the structured surface of the silicon substrate with the aid of vacuum pressure in the recesses, which acts to draw the glass into the recesses. The glass is then resolidified, and material is removed from the resolidified glass region in such a manner that the resolidified glass region assumes a surface which is flush with the structured surface of the silicon substrate thereby forming a wafer. In this regard, features of the structured surface of the silicon substrate extend through the resolidified glass region. Material may also be removed from a rear side of the silicon substrate to expose the resolidified glass region in certain areas to further thin the wafer. In this regard, the resulting wafer can be structured to include the glass and silicon regions. The combined thickness of the resulting glass and silicon regions that are bonded together is typically between 0.1 to 1 mm. However, wafers that comprise glass and silicon regions formed through the process as described above are extremely fragile and generally cannot be thinned below the thickness of 0.1 mm without fracturing due to insufficient adhesion between the glass and silicon regions. While portions of the wafers may be salvaged, fracturing is undesirable and complicates additional processing steps. Furthermore, it is difficult to obtain adequate flow of the glass into recesses having a width of less than 100 μm.

Given the ongoing drive to minimize components of electronic microsystems that can make use of glass substrates having material embedded therein, there remains an opportunity to further develop methods of structuring such glass substrates that enable smaller thicknesses of the glass substrates to be achieved while maintaining the bond between the electrically-conductive material and glass such that the glass substrates remain intact at thicknesses of less than 0.1 mm. There also remains an opportunity to minimize feature sizes of the material embedded in the glass substrates while enabling enhanced flow of the glass into recesses during embedding of the material in the glass substrates.

SUMMARY OF THE INVENTION AND ADVANTAGES

The instant invention provides a method of embedding material in a glass substrate. The method includes the steps of providing a glass composition and providing a mold substrate having a patterned surface defining a recess therein. The mold substrate having the patterned surface is formed from a material having a higher reflow temperature than the glass composition. The method also includes the step of increasing a surface wettability of the patterned surface relative to the glass composition. At least a portion of the glass composition is flowed into the recess defined by the patterned surface of the mold substrate, followed by solidifying the glass composition on the patterned surface of the mold substrate to form a solidified glass layer. Material is removed from the solidified glass layer until a portion of the underlying patterned surface of the mold substrate is exposed with at least a portion of the mold substrate embedded in the solidified glass layer to thereby form the glass substrate having the material embedded therein.

The step of increasing the surface wettability of the patterned surface of the mold substrate relative to the glass composition results in more complete bonding between the solidified glass layer and the patterned surface of the mold substrate. In particular, it is notable that, even by creating a vacuum in the recesses as is practiced in known processes of structuring wafers comprising glass and silicon regions, complete filling of the recesses (especially corners thereof) with the glass composition during the flowing step remains a challenge and it has been found that gaps in bonding are present between the resolidified glass region and side walls of the mold substrate in the recesses. As a result of incomplete filling of the recesses with the glass, substrates that comprise glass and material embedded therein through existing processes generally cannot be thinned below a threshold thickness without fracturing due to insufficient bonding between the resolidified glass regions and the side walls of the mold substrate in the recesses. Furthermore, it is difficult to adequately flow the glass into recesses having a width of less than 100 μm. By increasing the surface wettability of the patterned surface of the mold substrate relative to the glass composition, the flow of the glass composition over the patterned surface is promoted, which results in more complete bonding, leads to the ability to thin the resulting glass substrates the electrically-conductive material embedded therein to thicknesses that have not been achievable to date without fracturing, and enables adequate filling of recesses having widths of less than 100 μm.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1A:
FIG. 1 is a schematic flow chart generally illustrating steps in one embodiment of the method of the instant invention.

Referring to the Figures, where like numerals indicate like or corresponding parts through the several views, a method of embedding material 12 in a glass substrate 10 is provided herein and is shown schematically in FIGS. 1 and 2. The glass substrates 10 formed in accordance with the method of the instant invention have wide-ranging uses as described in further detail below, especially for purposes of solving problems associated with forming through-glass vias 48 and other electrically-conductive elements embedded in glass for use in electronic microsystem applications such as implantable microsystems, where biocompatibility, size, and extremely low power consumption are design considerations. The method of the instant invention avoids many problems associated with conventional techniques for embedding material in glass, and further alleviates conditions that limit minimum thicknesses that can be achieved for glass substrates 10 including material 12 embedded therein that are formed through existing methods. The method of the instant invention also enables processing at the wafer level and benefits from bulk manufacturing capabilities to produce multiple glass substrates 10 on a single glass wafer 52, whereas many existing methods of embedding material in glass substrates 10 require batch processing. In particular, the method of the instant invention can be utilized to produce the glass wafer 52 that contain multiple glass substrates 10 that can be separated and used in later processing steps for fabricating the electronic microsystems 50.

A glass composition 14 is provided in accordance with the method of the instant invention. Advantages of using the glass composition 14 over other materials include low electrical losses, excellent capabilities for forming hermetic seals, and excellent biocompatibility. The glass composition 14 also possesses mechanical properties that may be of additional use for electronic microsystems 50. Typically, the glass composition 14 is capable of anodic bonding, which correlates to a high alkali content. Borosilicate glasses represent one specific type of glass composition 14 that may be capable of anodic bonding. Borosilicate glasses are especially suitable when the material 12 to be embedded therein comprises silicon (as described in further detail below) due to substantial matching of coefficients of thermal expansion and because anodic bonding is possible between silicon and the borosilicate glass. However, it is to be appreciated that the instant invention is not limited to use of borosilicate glass as the glass composition 14, and other types of glass are also suitable for the glass composition 14. For example, other types of suitable glass may include soda lime glass, and any type of glass containing ions such as sodium. Further, it is to be appreciated that anodic bonding is not a requirement of the instant invention, and that other bonding techniques such as fusion or direct bonding may be employed that result in suitable bond strength between the glass composition 14 and the material 12 embedded therein. In this regard, glass that may not be capable of anodic bonding may also be suitable for the glass composition 14 when the other bonding techniques are employed.

As shown in FIG. 1A, a mold substrate 16 is also provided in accordance with the method of the instant invention. The mold substrate 16 is used for shaping the glass composition 14 upon flowing the glass composition 14 onto the mold substrate 16, as described in further detail below. Further, at least a portion of the mold substrate 16 provides the material 12 that becomes embedded in the glass substrate 10. As such, the mold substrate 16 is formed from a material that has a higher reflow temperature than the glass composition 14, which resists melting upon contact with the glass composition 14 during the step of flowing the glass composition 14. Because the material 12 is to be embedded in the glass substrate 10, the material 12 typically has a coefficient of thermal expansion that is substantially matched to that of the glass in the glass substrate 10. By "substantially matched", it is meant that a difference between coefficients of thermal expansion is less than about $5 \times 10^{-6}/°$ C. The material 12 to be embedded in the glass substrate 10 is typically electrically-conductive. More specifically, the material 12 to be embedded in the glass substrate typically has a resistivity of less than or equal to 0.10 Ohm cm, although it is to be appreciated that electrical conductivity is application-dependent and, under some circumstances, higher resistivity than 0.10 Ohm cm may be suitable for some applications. It is also to be appreciated that the material 12 to be embedded in the glass substrate 10 may have much higher resistivity, and may be an insulative material. For example, in one embodiment, the material of the mold substrate 16 is further defined as a semiconductor material comprising silicon. The semiconductor material may be further defined as a doped silicon composition, which is ideal for ultimately functioning as an electrical interconnect in the final glass substrate 10. The instant invention is not limited to the type of dopants that can be included in the doped silicon composition. However, suitable dopants include P-type dopants such as boron and gallium, or N-type dopants such as phosphorous and arsenic. In another embodiment, the material of the mold substrate 16 is further defined as metallic material comprising metal. An example of one suitable metallic material that can be used for purposes of the instant invention is a nickel-cobalt ferrous alloy commercially available under the tradename KOVAR®, which has a coefficient of thermal expansion that sufficiently matches that of borosilicate glass. It is to be appreciated that, under some circumstances, the mold substrate 16 may be designed such that both the semiconductor material and the metallic material can be embedded in the glass substrate 10 through the method of the instant invention. It is also to be appreciated that the material of the mold substrate 16 may be chosen based upon the intended application for the resulting glass substrate 10. Considerations for the material 12 to be embedded in the glass substrate 10 may be dependent on whether the glass substrate 10 is to be used in high frequency applications, and may further depend upon resistance requirements. It is also to be appreciated that the material 12 to be embedded in the glass substrate 10 may have insulative properties, an example of which is undoped silicon. Materials 12 such as undoped silicon can be employed to form holes in the glass substrate 10 by subsequently removing the undoped silicon through etching, followed by electroplating an electrically-conductive material into the resulting holes.

Figure 1B:
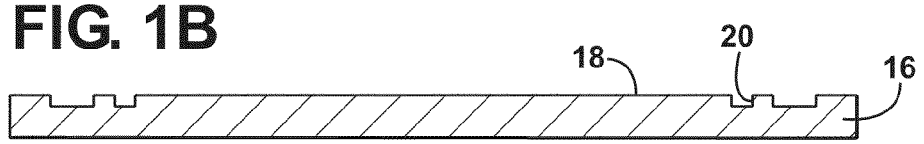

As shown in FIG. 1B, the mold substrate 16 has a patterned surface 18 that defines a recess 20 therein. It is to be appreciated that the patterned surface 18 may define a plurality of recesses 20 therein. By defining the recess(es) 20, raised portions 58 of the patterned surface 18 are formed and, through further processing steps described in further detail below, become the material 12 that is embedded in the glass substrate 10. As set forth above, the mold substrate 16 is used for shaping the glass composition 14 upon flowing the glass composition 14 onto the mold substrate 16. More specifically, it is the patterned surface 18 of the mold substrate 16 that receives the glass composition 14 during the step of flowing the glass composition 14. In this regard, the patterned surface 18 serves to shape the glass composition 14. However, at least a portion of the mold substrate 16 is also embedded into the glass composition 14 through the method of the instant invention as described in further detail below. As such, the mold substrate 16 does not merely shape the glass composition 14 when used in accordance with the method of the instant invention, but also becomes at least partially embedded within the glass composition 14.

Figure 1C:
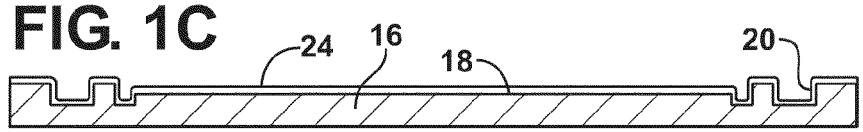

In one embodiment, the mold substrate 16 is provided already having the patterned surface 18 defining the recess 20 therein. In another embodiment, the method of the instant invention further includes the step of patterning the surface of the mold substrate 16 to form the patterned surfacing defining the recess 20 therein. Methods of patterning mold substrates 16 are known in the art and include both mechanical techniques and chemical etching techniques. Suitable chemical etching techniques are dependent upon the type of material used to form the mold substrate 16. When semiconductor compositions are used that comprise silicon, a deep reactive-ion etching (DRIE) step can be used to pattern the surface of the mold substrate 16. Minimum feature size in the pattern surface is only limited by current DRIE processes. In one embodiment, a single mask (not shown) may be used to etch the recess(es) 20 in a first step, resulting in a patterned surface 18 as shown in FIG. 1B defined along two parallel planes, with the first plane represented by unmodified portions of the surface of the mold substrate 16 and the second plane represented by etched portions of the surface of the mold substrate 16. As a point of reference, the planes may also be described as being parallel to a solidified glass layer 22, which results of solidification of the glass composition 14 after flowing the glass composition 14 onto the patterned surface 18 of the mold substrate 16. Optional additional DRIE steps may be performed, resulting in a patterned surface 18 as shown in FIG. 1C defined along at least three parallel planes, with the first plane and second plane the same as described above, and with the third and any subsequent planes represented by portions of the surface of the mold substrate 16 that are etched through the additional DRIE step. FIG. 1 illustrates how a cavity 56 comprising the material 12 can be embedded in the glass substrate 10. To explain, in the additional DRIE step as shown in FIG. 1C, part way through the etch, a new mask is exposed, with etching continued on unmasked portions of the mold substrate 16. The newly exposed areas etch to a final depth much less than the previously exposed areas. Holes in the mold substrate 16 can also be defined in a similar fashion. It is also to be appreciated that the cavity 56 comprising the material 12 may be removed to leave a void in the glass substrate 10.

Figure 7:
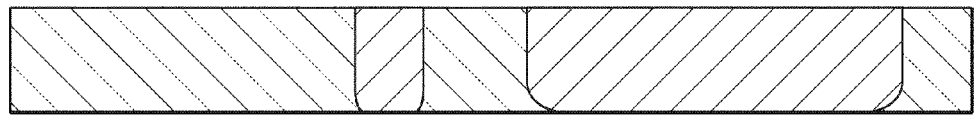
FIG. 7 is a schematic view of a glass substrate having material embedded therein with the material having rounded features.

There are other techniques available to pattern the surface of the mold substrate 16 comprising the semiconductor material other than DRIE steps, which result in generally vertical etching. For example, by using an isotropic wet or dry etchant, rounded features 30 can be fabricated in the semiconductor material, resulting in a shape of the semiconductor material as shown in FIG. 7.

As set forth above, the glass substrates 10 formed in accordance with the method of the instant invention are especially suited for electronic microsystems 50. As such, the scale of the recess(es) 20 defined by the patterned surface 18 is generally in the sub-millimeter range. Typically, the patterned surface 18 of the mold substrate 16 is free from any recesses 20 having a depth of greater than 1000 µm, and is more typically free from any recesses 20 having a depth of greater than 250 µm. Depth of the recesses 20 is also dependent on the final thickness of the glass substrate 10. For example, as described in further detail below, the final glass substrate 16 may have a thickness of about 250 µm, under which circumstances the patterned surface 18 of the mold substrate is typically free from any recesses 20 having a depth of greater than 250 µm.

Figure 1D:
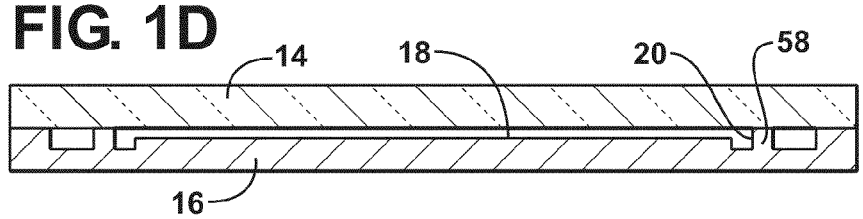
Figure 1E:
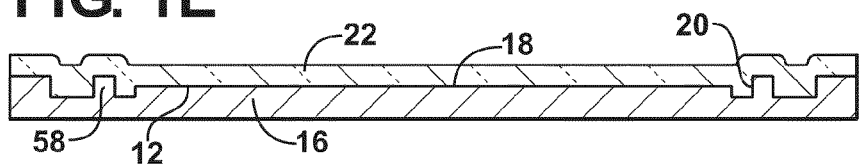

As alluded to above, the method further includes the step of flowing at least a portion of the glass composition 14 into the recess(es) 20 defined by the patterned surface 18 of the mold substrate 16, which allows the glass composition 14 to take virtually any shape while still maintaining structural integrity. To flow the glass composition 14 into the recess(es) 20, the glass is disposed adjacent to the patterned surface 18 of the mold substrate 16. In one embodiment, when the glass composition 14 is capable of anodic bonding, the glass composition 14 may be anodically bonded to the patterned surface 18 of the mold substrate 16 under vacuum prior to the step of flowing the glass composition 14 into the recess 20 (as shown in FIG. 1D) to thereby disposed the glass composition 14 adjacent to the patterned surface 18. Anodic bonding results in a high-quality gas-tight bond between the glass composition 14 and the mold substrate 16 and is a well known process. By performing anodic bonding under vacuum, the glass composition 14 is essentially pulled into the recess(es) 20 in the patterned surface 18 during the following step of flowing the glass composition 14. Alternatively, beads of the glass composition 14 (or other similarly particulate form of the glass composition 14) may be disposed on the patterned surface 18 of the mold substrate 16, with the glass beads generally conforming to the shape of the patterned surface 18. The glass beads typically have a diameter that is scaled to the size of the recess(es) 20 in the patterned surface 18, and are typically small enough to fit within the smallest recesses 20 in the patterned surface 18. In this regard, the glass composition 14 can be disposed in intimate contact with the patterned surface 18, and vacuum pressure may not be required to achieve sufficient flow of the glass composition 14 into the recess(es) 20. Further, the amount of the glass composition 14 used may be significantly less when glass beads are employed, so less glass is removed during subsequent planarization steps that are described in further detail below.

Once disposed adjacent to the patterned surface 18, the glass composition 14 is typically heated to a reflow temperature thereof, resulting in flow of the glass into the recesses 20. In one specific example, when borosilicate glass is used in the glass composition 14, the glass composition may be heated to a temperature of at least 750° C. for purposes of flowing the glass into the recesses 20. With regard to the embodiment shown in FIG. 7 when an isotropic wet or dry etchant is used and rounded features 30 are formed in the mold substrate 16, reflow of the glass results in the glass taking the shape of the rounded features 30 formed in the mold substrate 16.

For purposes of heating the glass composition 14, one possibility is to use a Rapid Thermal Annealing (RTA) furnace, which operate over a very short time period (up to 10 minutes), but at very high temperatures (>1000° C.). In this regard, the advantage of using the RTA furnace is that the glass composition 14 can reflow at a much faster rate, reducing reflow time. A glass reflow effect may also be achieved by generating a strong electrostatic field.

Figure 10:
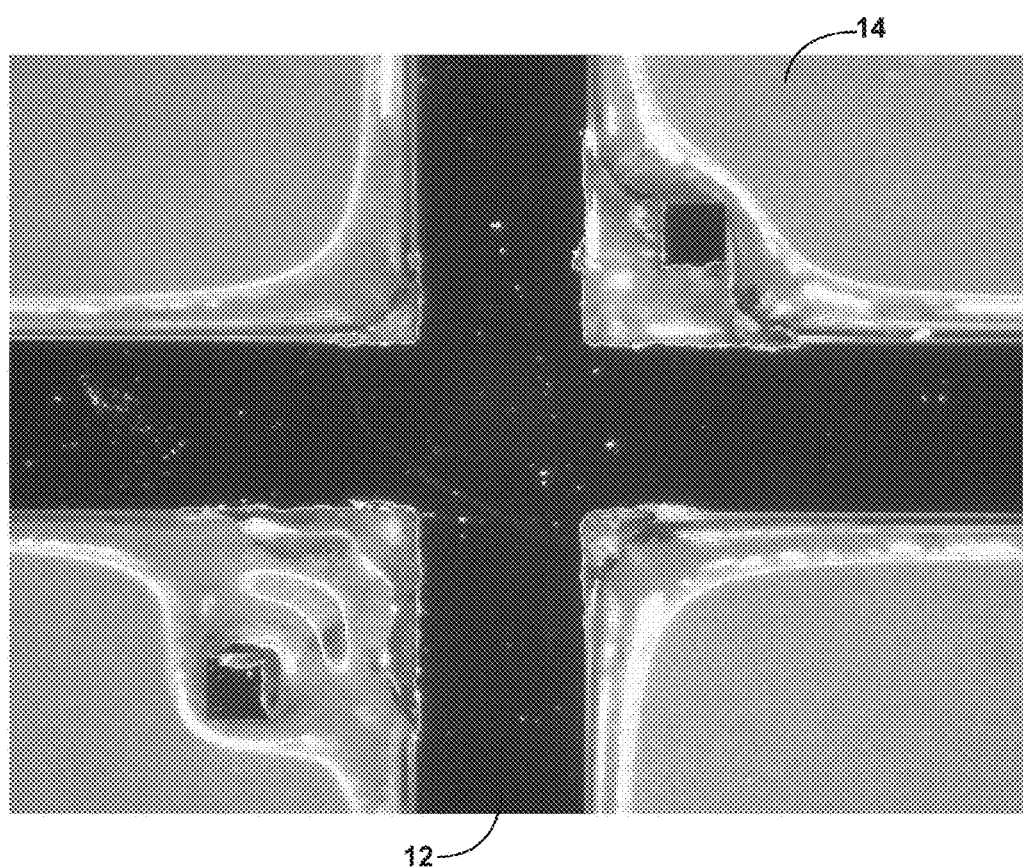
FIG. 10 is a photograph of inadequate glass filling in a mold substrate, wherein surface wettability of the patterned surface of the mold substrate is not increased.

As mentioned above, vacuum is generally used to essentially pull the glass composition 14 into the recesses 20. Under such circumstances, any trapped gasses may prevent complete glass filling as shown in FIG. 10. One way to avoid the trapped gasses problem may be to heat the glass composition 14 to a high enough temperature such that the trapped gas travels through the glass composition 14 until it is released to the surrounding atmosphere. However, when the glass beads are used, it is believed that trapped gasses will be less of a concern. Once the glass composition 14 and mold substrate 16 are heated above the glass transition temperature of the glass composition 14 while in intimate contact, a bond is formed between the mold substrate 16 and the glass composition 14, followed by solidifying the glass composition 14 on the patterned surface 18 of the mold substrate 16 to form the solidified glass layer 22 that is briefly mentioned above. In order to reflow the glass layer 22, however, the temperature may have to be elevated much higher to release the trapped gas as described previously.

One of the biggest challenges associated with the step of flowing the glass composition 14 into the recess(es) 20 is maximizing glass filling in the recess(es) 20. Surprisingly, it has been discovered that enhanced flowing of the glass composition 14 into the recess(es) 20 can be achieved by increasing a surface wettability of the patterned surface 18 relative to the glass composition 14, resulting in a reduction in pitch dimensions of the glass composition 14 relative to side walls of the recess 20 below initial limiting pitch dimensions. As such, minimum feature size of the recesses 20 defined by the patterned surface 18 can be decreased to below 100 µm, and in some cases down to 25 µm, while still achieving adequate glass filling in the recess(es) 20.

The type of material of the mold substrate 16 is a consideration, whether it is silicon, metal, or some other material that is grown or deposited (e.g. evaporated metals) thereon, due to differences in surface wettability between different materials. Those of skill in the art will readily appreciate that the step of increasing the surface wettability can be adjusted based upon the type of material of the mold substrate 16. In one embodiment, the step of increasing the surface wettability of the patterned surface 18 is further defined as roughening the patterned surface 18, which reduces resistance of the glass composition 14 to flowing over the patterned surface 18 of the substrate. The patterned surface 18 can be physically roughened, for example by using sand blasting. Any degree of roughening of the patterned surface 18 is suitable for purposes of the instant method. In another embodiment, the step of increasing the surface wettability of the patterned surface 18 is further defined as dry etching the patterned surface 18, such as with xenon difluoride. Isotropic wet etching and plasma etching may also be used to increase the surface wettability of the patterned surface 18. Inductively coupled plasmas such as those employed in DRIE processes may be used. Adequate roughing of the patterned surface 18 is generally determined through visual inspection. Prior to roughening, the patterned surface 18 has a polished appearance and is highly reflective. After roughing, the patterned surface 18 is noticeably darkened and non-reflective. In another embodiment, the step of increasing the surface wettability of the patterned surface 18 is further defined as disposing a layer of wetting material 24 on the patterned surface 18 with the wetting material 24 having increased wettability relative to the glass composition 14 as compared to the material of the mold substrate 16. The wetting material 24 also has a higher melting point than the glass composition 14, and further has a higher melting point than a temperature at which the glass composition 14 is flowed into the recess(es) 20. For example, when the mold substrate 16 is formed from a semiconductor material such as doped silicon, the patterned surface 18 may be coated with a thin layer of the wetting material 24 such as platinum that has increased wettability relative to the glass composition 14 as compare to the doped silicon of the mold substrate 16. Thickness of the wetting material 24 on the patterned surface 18 is typically minimized to avoid bonding complications between the glass composition 14 and the patterned surface 18 of the mold substrate 16. In this regard, the thickness of the wetting material 24 is typically less than 0.1 µm. Combinations of steps to increase the surface wettability of the patterned surface 18 are also possible. For example, one option may be to deposit the wetting material 24 such as platinum on a bottom surface of the recess(es) 20, while roughening the side walls of the recess(es) 20.

Besides increasing the surface wettability of the patterned surface 18, a combination of other variables may be controlled to maximize filling of the recess(es) 20 in the patterned surface 18 of the mold substrate 16 with the glass composition 14. For example, etching techniques may be employed to form rounded features 30 in the mold substrate as shown in FIG. 7, which may promote filling of the recesses 20. It is theorized that another reason for why the glass composition 14 may not completely fill the recess(es) 20 is due to the lower energy of slow-moving glass. As such, a combination of vacuum, reflow temperature and time, and heating rate may be set to maximize filling of the recess(es) 20, thereby reducing the amount of energy acquired for the glass to physically move. In one embodiment, the step of flowing at least a portion of the glass composition 14 into the recess 20 is further defined as heating the glass composition 14 to a reflow temperature thereof with the RTA furnace described above. By increasing temperature dramatically (and/or quickly), gravity can accelerate the glass composition 14 much faster, increasing the amount of energy useable for glass flow. When anodic bonding of the glass composition 14 is employed with vacuum used to pull the glass composition 14 into the recess (es) 20 during the step of flowing the glass composition 14, theoretical calculations can be done if the vacuum captured inside the sealed recess(es) 20 is known—a force balance at the reflow temperature can be calculated. On one side, the pull-in force of the vacuum pulls the liquid glass composition 14 in, while stiction/friction forces of the glass composition 14 flowing over the patterned surface 18 of the mold substrate 16 counters the pull-in force of the vacuum. At some point, the volume of the recess(es) 20 reduces to such a small amount that the strength of the pull-in force drops off to virtually zero. It is possible that flow of the glass composition 14 may stop before the pull-in force goes to zero due to the counter force in the opposite direction from the stiction/friction forces of glass composition 14 flowing over the patterned substrate.

Figure 1F:
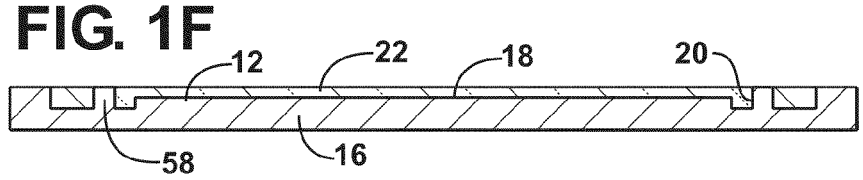
Figure 1G:
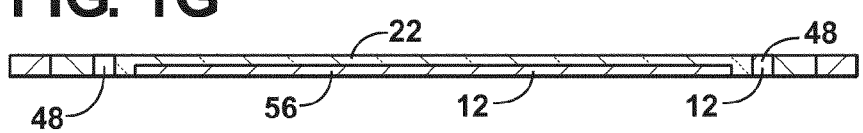

Once the glass composition 14 is solidified, material is removed from the solidified glass layer 22 until a portion of the underlying patterned surface 18 of the mold substrate 16 is exposed as shown in FIG. 1F. Typically, the step of removing the material from the solidified glass layer 22 is further defined as planarizing the solidified glass layer 22. However, it is to be appreciated that the instant invention is not limited to any particular technique of removing the material from the solidified glass layer 22. The portion of the underlying patterned surface 18 that becomes exposed may be embedded within the glass layer 22, such as the through-glass vias 48 that are shown in FIG. 1G, or may be disposed outside of the resulting glass layer 22 (as in circumstances in which the patterned surface 18 of the mold substrate 16 is used to gauge a final thickness of the glass substrate 10). Typically, the solidified glass layer 22 is planarized and polishing until the solidified glass layer 22 is flush with the exposed portion of the underlying patterned surface 18 of the mold substrate 16, as shown in FIG. 1F.

At least a portion of the mold substrate 16 remains embedded in the solidified glass layer 22, although it is to be appreciated that the portion of the underlying patterned surface 18 of the mold substrate 16 that is exposed after removing the material from the solidified glass layer 22 may be distinct from the portion of the mold substrate 16 that remains embedded in the solidified glass layer 22. For example, referring to FIG. 1G, it is clear that the cavity 56 is not exposed after removing the material from the solidified glass layer 22, and it is possible that the cavity 56 may be the present in the final glass substrate 10 in the absence of through glass vias 48.

In one embodiment, material is removed from a surface of the mold substrate 16 that is opposite the patterned surface 18, thereby leaving at least a portion of the mold substrate 16 embedded in the solidified glass layer 22 as shown in FIG. 1G. Typically, the step of removing the material from the surface of the mold substrate 16 is performed until a portion of the glass layer 22 is exposed. However, it is to be appreciated that removing the material from the surface of the mold substrate 16 is an optional step, and that the final glass substrate 10 with the material 12 embedded therein may be obtained without the step of removing the material from the surface of the mold substrate 16 that is opposite the patterned surface 18.

Several optional techniques can be employed during the steps of removing the material from the solidified glass layer 22 and removing the material from the surface of the mold substrate 16 that is opposite the patterned surface 18, such as wet etching using hydrofluoride to speed the removal of glass and potassium hydroxide to speed removal of silicon. One of the biggest challenges with the instant method is removing the material from the surface of the mold substrate 16 that is opposite the patterned surface 18. Commercial tools exist and are currently used to thin wafers down to within +/−25 μm with good repeatability while some tools can approach +/−5 μm. Another option is to employ the Dissolved Wafer Process (DWP), in which a boron diffusion step after the patterned surface 18 has been formed in the mold substrate 16. The boron diffusion step serves to form a concentration-based etch stop, which enables repeatable control over the removal of the material from the surface of the mold substrate 16 that is opposite the patterned surface 18 with great precision.

Referring to FIG. 2, the glass substrate 10 may be formed in the absence of the step of removing material from the surface of the mold substrate 16 that is opposite the patterned surface 18. In this embodiment, the mold substrate 16 is disposed on a planar sacrificial layer 26. The planar sacrificial layer 26 is typically disposed between the mold substrate 16 on one side and a carrier wafer 28 on another side thereof, with the mold substrate 16 and carrier wafer 28 separated by the width of the planar sacrificial layer 26. The planar sacrificial layer 26 is typically formed from an oxide or nitride and serves as an etch stop as shown in FIG. 2B. The step of patterning the surface of the mold substrate 16 may be performed as described above through etching. After flowing the glass composition 14 into the recess(es) 20 defined by the patterned surface 18 and solidifying the glass composition 14 to form the glass layer 22, the mold substrate 16 and the solidified glass layer 22 may be released from the planar sacrificial layer 26 by dissolving the planar sacrificial layer 26. In one example, the planar sacrificial layer 26 is formed from nitride, which can be etched in a highly-selective etchant such as hot phosphoric acid. This allows the carrier wafer 28 to be reused by fusion bonding a new, fresh mold substrate 16 of known thickness thereto to restart the process once more. The carrier wafer 28 may define holes 32 to allow liquid etchant to act quicker on the planar sacrificial layer 26 during the release step.

By using the planar sacrificial layer 26, problems associated with non-uniform etching may be addressed because the etching it is not based on time, but rather based on the material etched. Another advantage associated with employing the planar sacrificial layer 26 is that the mold substrate 16 and carrier wafer 28 can be separated at any time by simply dissolving the planar sacrificial layer 26. Another advantage associated with employing the planar sacrificial layer 26 is that the resulting glass substrate 10 including the material 12 embedded therein does not require mechanical lapping or chemical polishing of the material from the surface of the mold substrate 16 that is opposite the patterned surface 18.

Under conditions in which the material is removed from the surface of the mold substrate 16 that is opposite the patterned surface 18 to expose the solidified glass layer 22, or under conditions in which the mold substrate 16 is disposed on the planar sacrificial layer 26, the wafer may rely upon bonds between the glass layer 22 and the side walls of the mold substrate 16 in the recesses 20 to remain intact due to removal of portions of the mold substrate 16 that represent a bottom of the recesses 20 (which is necessary to expose the resolidified glass region). In this regard, pitch dimensions of the glass composition 14 relative to side walls of the recess 20 correlate to the bond surface area between the glass layer 22 and the side walls of the recess 20. As such, more complete flow of the glass composition 14 into the recess(es) 20 directly correlates to minimum thicknesses that can be achieved for the resulting glass substrate 10 including the material 12 embedded therein. In particular a total thickness of the glass substrate 10 including the material 12 embedded therein, after any steps of removing material from the solidified glass layer 22 and mold substrate 16, is as low as 25 μm. Typical thicknesses of the glass substrate 10 including the material 12 embedded therein range from about 25 μm to 1000 μm, alternatively from 25 μm to 250 μm, alternatively from 25 μm to 100 μm.

Figure 8:
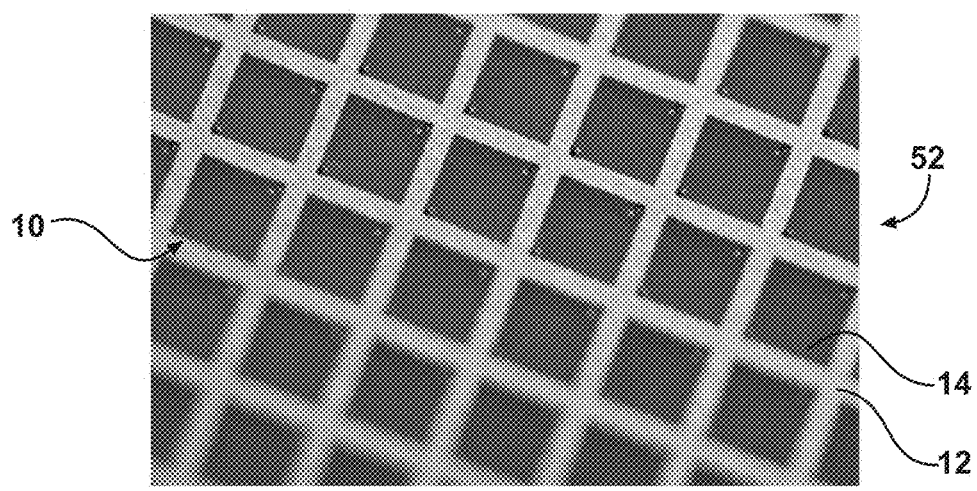
FIG. 8 is a photograph of a glass wafer containing multiple glass substrates, each device having two through-glass vias formed from a material embedded in the glass substrates.
Figure 9:
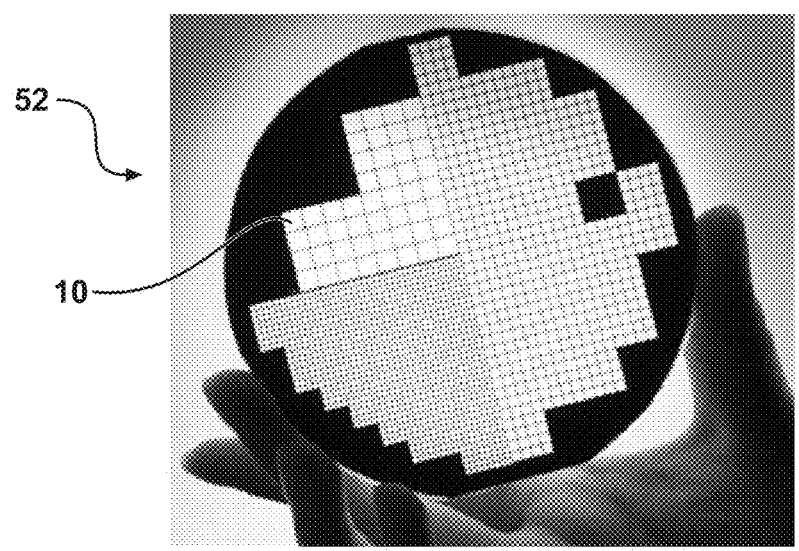
FIG. 9 is a photograph of a glass wafer containing multiple glass substrates formed in accordance with the method of the instant invention and having a thickness of about 250 μm.

As indicated above, the method of the instant invention enables processing at the wafer level and may enable formation of a glass wafer 52 containing multiple glass substrates 10 formed in accordance with the method of the instant invention. A glass wafer 52 is shown in the photographs of FIGS. 8 and 9. Known separation techniques may be employed to separate the glass substrates 10 from the glass wafer 52.

Additional optional processing steps may also be employed in accordance with the method of the instant invention. As one example, a mask can be used to protect the entire glass substrate 10 including the material 12 embedded therein, except for certain areas of the embedded material 12 that are exposed. When the embedded material 12 comprises silicon, a dry etch such as xenon difluoride (XeF2) may be used to remove the embedded material 12, thereby leaving behind holes (not shown) in the glass substrate 10. Various metals, including copper and silver, can be electroplated through the resulting holes. Additional masking steps can be used to electroplate multiple materials through the glass substrate 10, such as a silver sheath and a copper core, for example. Therefore, hybrid silicon-glass-metal wafers, for example, are possible although it is to be appreciated that any material can be used to fill the holes.

Figure 3A:
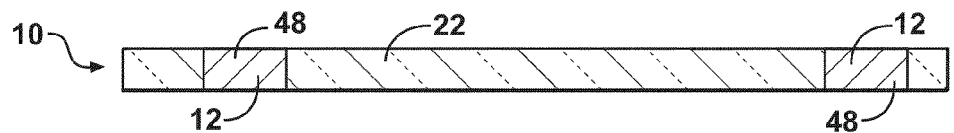
FIG. 3 is a schematic flow chart generally illustrating steps taken to avoid anodic bonding shorts when anodically bonding a semiconductor wafer to a glass substrate having material embedded therein.
Figure 3B:
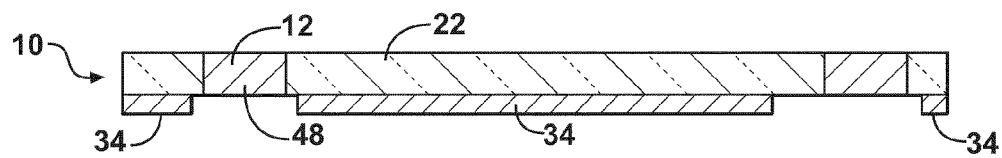
Figure 3C:
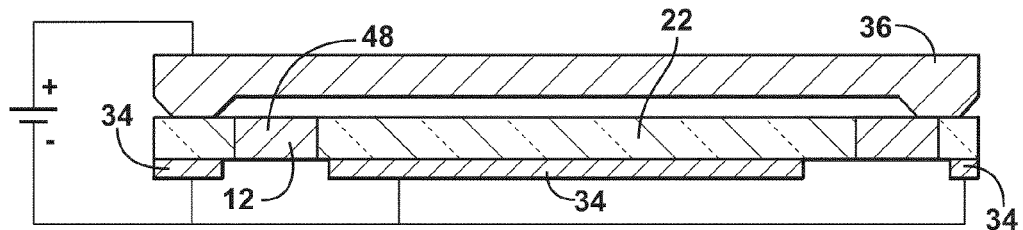
Figure 3D:
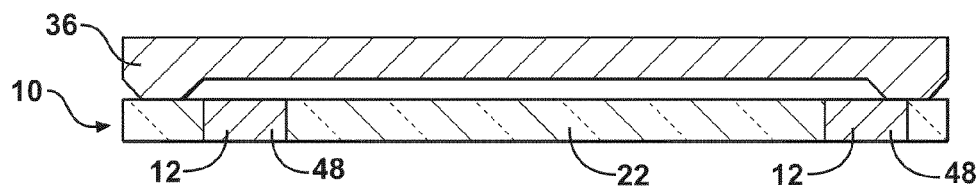

An additional optional step may include bonding additional layers onto the glass substrate 10. When glass compositions 14 are used that are capable of anodic bonding, for example, another semiconductor wafer 36 can be bonded to the glass substrate 10 including the material 12 embedded therein, as shown in FIGS. 3C and 3D. More specifically, the semiconductor wafers 36 can be bonded to glass layer 22 in the glass substrate 10, providing an excellent seal for devices such as pressure sensors, which are required to be sealed. Care must be taken such that the bonding apparatus only makes contact with the glass layer 22 in the glass substrate 10, and does not touch any exposed material 12 embedded in the glass substrate 10 to prevent an electrical short. The presence of an electric short can prevent the bond from proceeding and may even prevent bonding from occurring at all. A solution to this problem is to apply electrically conducting extensions 34 to the glass layer 22 only so that no shorting can occur. A diagram to better illustrate this potential source for error and the solution is shown in FIG. 3.

The glass substrate 10, as it is referred to herein, is the article resulting from the method of the instant invention that includes the remaining solidified glass layer 22 and the material 12 embedded therein remaining from the mold substrate 16. Because of the robustness of the glass substrates 10 prepared in accordance with the method of the instant invention, whole wafers can be designed with regions of glass and regions of the embedded material 12 on the same wafer.

Potential applications range from the through-glass vias 48, to passive electrical and even microfluidic components. A sample master wafer 52 is pictured in FIG. 8. In some cases, it may be more useful to attach a carrier wafer 28 so that the wafer is more robust and easier to handle. At thicknesses less than approximately 150 μm, the wafer is extremely fragile. FIG. 9 shows a close-up of silicon vias manufactured using this technique. These wafers have not been polished.

There are many possible applications that can arise from the method of the instant invention, due to the nature of the two different materials (i.e., the glass and the embedded material 12) flush and chemically bonded to each other. In this manner, the differences between the glass and the embedded material 12 can be exploited laterally. For example, microfluidics devices can take advantage of the hydrophobicity of silicon versus the hydrophilicity of glass regions.

Figure 2A:
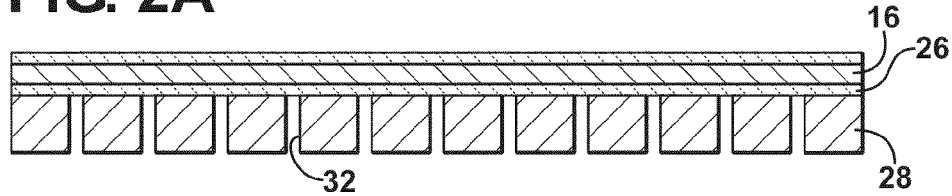
FIG. 2 is a schematic flow chart generally illustrating steps in another embodiment of the method of the instant invention.
Figure 2B:
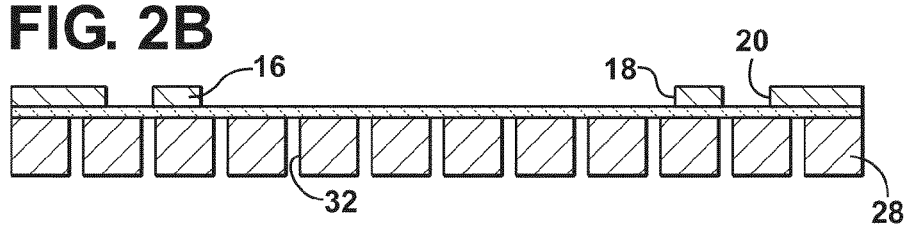
Figure 2C:
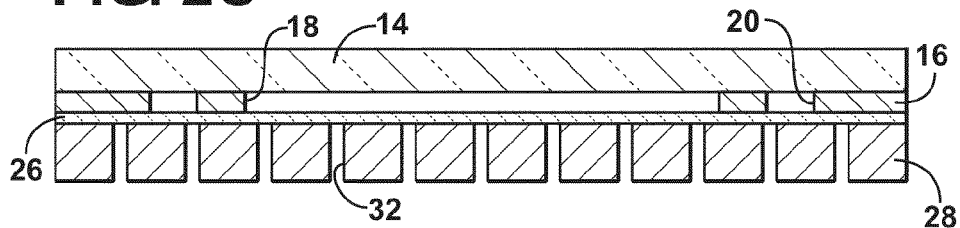
Figure 2D:
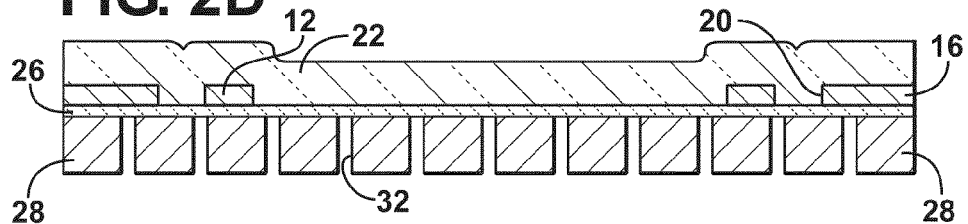
Figure 2E:
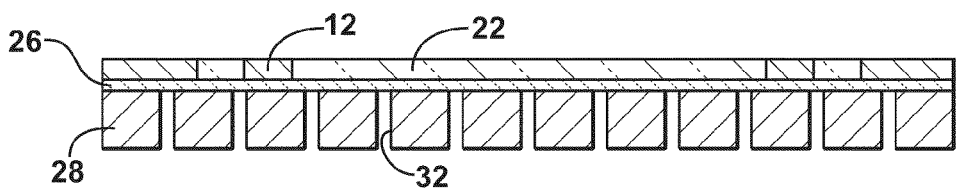
Figure 2F:
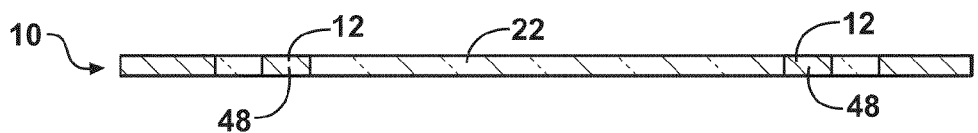
Figure 4:
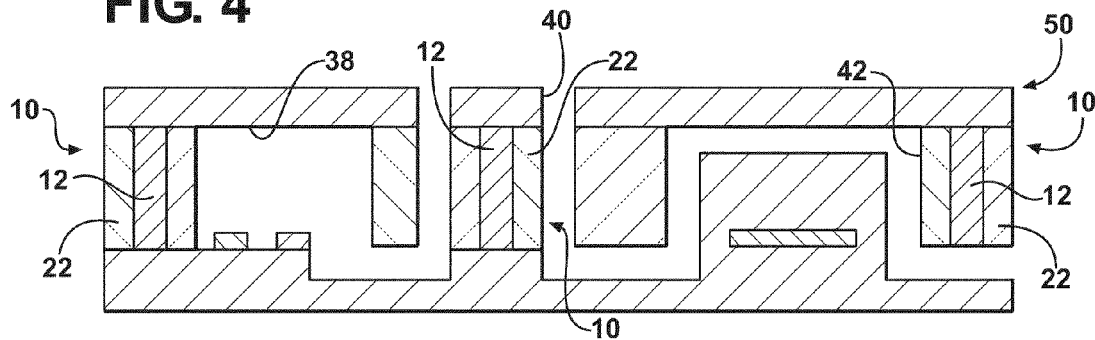
FIG. 4 is a schematic view of microfluidic components including a glass substrate having material embedded therein.
Figure 6:
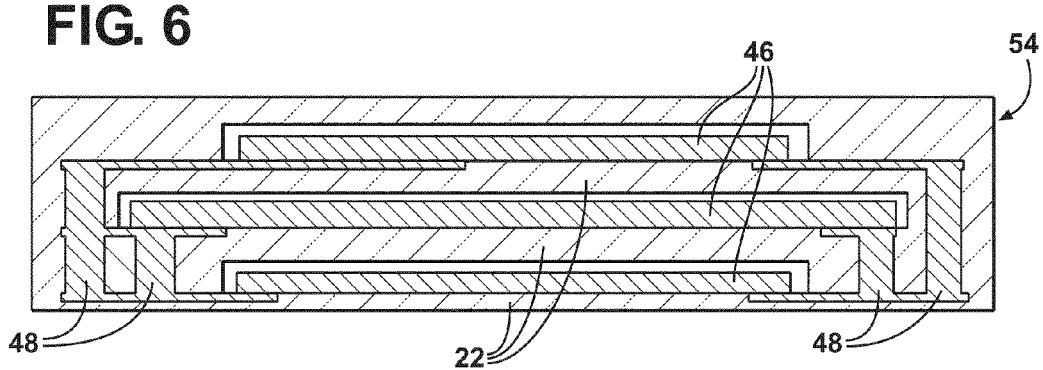
FIG. 6 is a schematic view of a stacked integrated circuit including glass substrates having material embedded therein.

As alluded to above, one specific application for the method of the instant invention is the formation of through-glass vias 48, examples of which are illustrated in FIG. 1G, FIG. 2F, and in FIGS. 6 and 7. FIG. 4 shows a cross-sectional view of how a sensor may be implemented using glass substrates 10 formed in accordance with the method of the instant invention. While the embedded material 12 is shown as comprising semiconductor material, it is to be appreciated that the embedded material 12 can comprise metal. Further, it is to be appreciated that selective removal of embedded material 12 can give rise to ports 40 and chambers 38, through which liquids or gasses can pass through to enter or move through the device shown in FIG. 4.

Referring to FIG. 4, glass substrates 10 prepared in accordance with the method of the instant invention can be used as components in microfluidic channels 42. There are many advantages for using glass in microfluidic channels 42. One example is the much reduced thermal conductivity of glass relative to silicon, which is a commonly used substrate for microfluidic channels 42. Thermal isolation between microfluidic channels 42 is important for certain chemical reactions to occur, such as in Polymerase Chain Reaction (PCR), used for DNA microfluidic chips. Lower thermal conductivity can mean less power used to heat the reagents as well as more localized and focused heating can occur. FIG. 4 illustrates several common components of microfluidic channels 42 that can make use of the glass substrates 10 prepared in accordance with the method of the instant invention.

Figure 5:
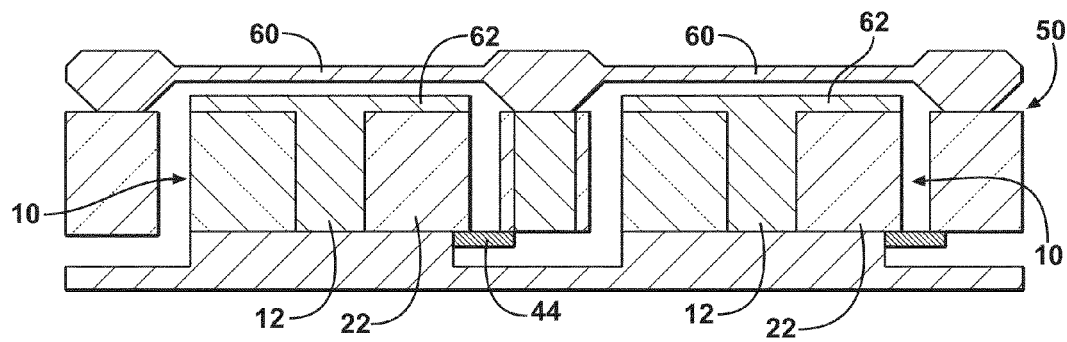
FIG. 5 is a schematic view of micropump having passive valves and including a glass substrate having material embedded therein.

Another application related to microfluidics is generating flow of a gas or liquid. The advantage of designing a micropump using glass substrates 10 prepared in accordance with the method of the instant invention includes simplified fabrication and improved robustness of the overall device. An example of a gas micropump cross-section is shown in FIG. 5. One side of the glass substrate 10 contains valves 44, while the other side contains moving diaphragms 60, actuated electrostatically. By integrating electrical interconnects next to fluidic ports, actuation electrodes 62 can be located directly underneath the diaphragm 60, allowing the pumping diaphragm 60 to have an excellent seal with the glass.

The integrated circuit (IC) industry is moving towards 3-D integration of multiple chips because of at least three major benefits: 1) reduced power consumption, 2) smaller dimensions, and 3) better performance. One example of this technology applied to a product is the 3-D integration of memory ICs with standard ICs to form a 3-D integrated device 54. Today, these two chips are fabricated separately, then stacked and wire bonded to each other, and finally inserted into a standard IC package. This has become a common enough issue that a standard has been written to further define this technique, called the Intimate Memory Interface Specification. The main technology currently being pursued in industry involves Through-Silicon Vias (TSVs). However, glass is superior to silicon in terms of providing better electrical isolation. The method of the instant invention may be used to move electrical connections off the IC or MEMS device 46 to a separate, modular component, with the purpose of providing vertical electrical connections or passive components such as resistors, capacitors, or inductors. This isolates the electrical pathways and dramatically reduces interference between signals, reduces induced noise, and reduces power consumption. It also simplifies construction of both the IC 46 and the through-glass vias 48 as they are independent components, reducing costs and increasing output yield when compared to TSV solutions. Another advantage of using through-glass vias 48 is that the 3-D integrated device 54 does not have to be redesigned to include feedthroughs, as opposed to TSVs, and is therefore applicable to devices 54 currently being produced. In a through-glass via solution, the glass electrically and thermally isolates one IC or MEMS device 46 from the next. Electrical connections are formed through the glass as needed, with lateral interconnects formed in much the same way they would on a conventional printed circuit board. FIG. 6 shows a cross-section of how this solution may be implemented.

Vertical feedthroughs can also be used in antenna applications, and may provide the benefit of reduced coupling between the antenna and the feed structure by placing the input on the reverse side of the device. The feedthrough also ensures a low impedance connection to the antenna. In addition, glass is a low-loss material when used as a substrate for radiating elements. With this technology, it is possible to also place a ground shield on the backside of the glass, useful for certain types of antennas.

High-Q factor electrical passive devices such as glass-core inductors (not shown) can also be fabricated in accordance with the method of the instant invention. When fabricate in accordance with the method of the instant invention, the quality factor of these components can be improved by approximately one order of magnitude as compared to onchip solutions. This may be important because many radio chipset manufacturers are integrating more external components on-chip to reduce costs and size for devices such as cell phones. By using inductors developed in this process, components such as amplifiers will have dramatically reduced power consumption, conserving battery power compared to on-chip solutions.

Obviously, many modifications and variations of the present invention are possible in light of the above teachings, and the invention may be practiced otherwise than as specifically described within the scope of the appended claims.

What is claimed is:

1. A method of embedding material in a glass substrate, said method comprising the steps of:
   providing a glass composition;
   providing a mold substrate having a patterned surface defining a recess therein and formed from a material having a higher reflow temperature than the glass composition;
   providing a planar sacrificial layer disposed between the mold substrate on one side and a carrier wafer on another side thereof, with the mold substrate and carrier wafer separated by the width of the planar sacrificial layer;
   increasing a surface wettability of the patterned surface relative to the glass composition;
   heating the glass composition to a reflow temperature such that at least a portion of the glass composition flows into the recess defined by the patterned surface of the mold substrate;
   solidifying the glass composition on the patterned surface of the mold substrate to form a glass layer;
   removing material from the solidified glass layer until a portion of the underlying patterned surface of the mold substrate is exposed with at least a portion of the mold substrate embedded in the solidified glass layer to form the glass substrate having the material embedded therein; and
   releasing the mold substrate and the solidified glass layer from the planar sacrificial layer after said step of flowing the glass composition into the recess.

2. A method as set forth in claim 1 wherein the step of increasing the surface wettability of the patterned surface is further defined as roughening the patterned surface.

3. A method as set forth in claim 1 wherein the step of increasing the surface wettability of the patterned surface is further defined as dry etching the patterned surface.

4. A method as set forth in claim 1 wherein the step of increasing the surface wettability of the patterned surface is further defined as disposing a layer of wetting material on the patterned surface with the wetting material having increased wettability relative to the glass composition as compared to the material of the mold substrate.

5. A method as set forth in claim 1 wherein the material of the mold substrate is further defined as a semiconductor material comprising silicon.

6. A method as set forth in claim 1 wherein the step of removing material from the solidified glass layer is further defined as planarizing the solidified glass layer.

7. A method as set forth in claim 6 wherein the solidified glass layer is planarized until a surface of the solidified glass layer is flush with a surface of the mold substrate.

8. A method as set forth in claim 1 wherein the step of flowing at least a portion of the glass composition into the recess is further defined as heating the glass composition to the reflow temperature with a rapid thermal annealing furnace.

9. A method as set forth in claim 1 further comprising the step of patterning the surface of the mold substrate to form the patterned surfacing defining the recess therein.

10. A method as set forth in claim 1 wherein the patterned surface of the mold substrate prior to the step of flowing the glass composition into the recess is defined along at least three parallel planes.

11. A method as set forth in claim 1 wherein the glass composition is capable of anodic bonding and wherein the glass composition is anodically bonded to the patterned surface of the mold substrate under vacuum prior to the step of flowing the glass composition into the recess.

12. A method as set forth in claim 1 wherein the step of flowing at least a portion of the glass composition into the recess comprises the further step of disposing beads of the glass composition on the patterned surface of the mold substrate.

13. A method as set forth in claim 1 wherein the patterned surface of the mold substrate is free from any recesses having a depth of greater than 1000 µm.

14. A method as set forth in claim 1 wherein a total thickness of the glass substrate including the material embedded therein is as low as 25 µm.

15. A glass substrate including the solidified glass layer and material embedded therein formed in accordance with the method of claim 1.

16. A method of embedding material in a glass substrate, said method comprising the steps of:
    providing a glass composition;
    providing a mold substrate having a patterned surface defining a recess therein and formed from a semiconductor material having a higher reflow temperature than the glass composition;
    increasing a surface wettability of the patterned surface relative to the glass composition;
    flowing at least a portion of the glass composition into the recess defined by the patterned surface of the mold substrate;
    solidifying the glass composition on the patterned surface of the mold substrate to form a glass layer;
    planarizing the solidified glass layer until a surface of the solidified glass layer is flush with a surface of the mold substrate;
    planarizing the mold substrate on a surface thereof opposite the patterned surface until a portion of the solidified glass layer is flush with at least a portion of the mold substrate embedded in the solidified glass layer to form the glass substrate having the material embedded therein;
    wherein a total thickness of the glass substrate including the material embedded therein is as low as 25 µm.

17. A method as set forth in claim 16 wherein the step of increasing the surface wettability of the patterned surface is further defined as roughening the patterned surface.

18. A method as set forth in claim 16 wherein the step of increasing the surface wettability of the patterned surface is further defined as dry etching the patterned surface.

19. A method as set forth in claim 16 wherein the step of increasing the surface wettability of the patterned surface is further defined as disposing a layer of wetting material on the patterned surface with the wetting material having increased wettability relative to the glass composition as compared to the material of the mold substrate.

20. A method as set forth in claim 1 wherein the planar sacrificial layer is formed from an oxide or nitride.

21. A method as set forth in claim 1 wherein the reflow temperature is at least 750° C.

22. A method of embedding material in a glass substrate, said method comprising the steps of:
    providing a glass composition;
    providing a mold substrate having a patterned surface defining a recess therein and formed from a semiconductor material having a higher reflow temperature than the glass composition;
    flowing at least a portion of the glass composition into the recess defined by the patterned surface of the mold substrate;
    solidifying the glass composition on the patterned surface of the mold substrate to form a glass layer;
    planarizing the solidified glass layer until a surface of the solidified glass layer is flush with a surface of the mold substrate;
    planarizing the mold substrate on a surface thereof opposite the patterned surface until a portion of the solidified glass layer is flush with at least a portion of the mold substrate embedded in the solidified glass layer to form the glass substrate having the material embedded therein.

23. A method as set forth in claim 22 wherein the material of the mold substrate is further defined as a semiconductor material comprising silicon.

24. A method as set forth in claim 22 further comprising the step of patterning the surface of the mold substrate to form the patterned surfacing defining the recess therein.

25. A method as set forth in claim 22 wherein the patterned surface of the mold substrate prior to the step of flowing the glass composition into the recess is defined along at least three parallel planes.

26. A method as set forth in claim 22 wherein the glass composition is capable of anodic bonding and wherein the glass composition is anodically bonded to the patterned surface of the mold substrate under vacuum prior to the step of flowing the glass composition into the recess.

27. A method as set forth in claim 22 wherein the step of flowing at least a portion of the glass composition into the recess comprises the further step of disposing beads of the glass composition on the patterned surface of the mold substrate.

* * * * *